Jan. 7, 1969 L. C. DREW ET AL 3,421,101

BROAD BAND HIGH GAIN VIDEO AMPLIFIER

Filed June 22, 1965

INVENTORS
LAURANCE C. DREW &
HAROLD F. KING
Edward J. Norton
Attorney

United States Patent Office
3,421,101
Patented Jan. 7, 196S 3,421,101

BROAD BAND HIGH GAIN VIDEO AMPLIFIER

Laurance C. Drew, Danvers, and Harold F. King, Dracut, Mass., assignors to Radio Corporation of America, a corporation of Delaware Filed June 22, 1965, Ser. No. 466,027
U.S. Cl. 330—20 8 Claims
Int. Cl. H03f *3/68;* H03f *1/34;* H03f *1/22*

ABSTRACT OF THE DISCLOSURE

Disclosed is a high gain wide bandwidth cascaded multi-stage transistor video amplifier, each stage of which has substantially the same gain and substantially the same bandwidth. The output of each stage is coupled to the input of the next subsequent stage by an emitter follower which has its input coupled directly to the output of the preceding stage. In addition an emitter follower couples the output of the last stage to the output of the amplifier. Each stage is provided with both adjustable high frequency current peaking negative current feedback and mid-frequency flattening negative voltage feedback to thereby provide a wide bandwidth with a sharp high frequency roll-off. The disclosed transistor video amplifier is unusual in that its overall bandwidth is substantially the same as the bandwidth of a single stage thereof, although the total gain of the amplifier is substantially equal to the product of the gains of the cascaded stages.

This invention relates to transistor amplifiers and, more particularly, to an improved broad-band, high-gain transistor amplifier.

One approach now employed to achieve a high gain, broad bandwidth transistor amplifier is the use of cascaded frequency compensated transistor amplifier stages. It is known that such cascaded amplifiers have a total risetime which is equivalent to the square root of the sum of the squares of the risetime of an individual stage of the amplifier. The risetime is inversely proportional to the bandwidth. Hence, each stage of a normally cascaded amplifier has a higher frequency response than the resultant composite. This approach thus results in the loss of bandwidth for the increased gain obtained.

In a second approach, a distributed amplifier using delay line techniques has been employed to afford a large bandwidth. However, the total voltage gain obtained by this approach is equal to the sum of the voltage gains of the individual stages instead of their product as is the case with the cascaded amplifier approach first mentioned above. Thus, in the second approach, gain is, in effect, traded off for the bandwidth obtained.

In addition to the disadvantages mentioned above, amplifiers of the type described have proven difficult to design, as individual tuning and adjustment for the stages therein are required; transistors have to be selected and often times, to achieve proper biasing and temperature stability, two power supplies are required.

It is therefore an object of the present invention to provide an improved broadband, high gain transistor amplifier.

Another object is to provide an improved broadband, multi-stage transistor amplifier whose gain is the product of the individual stages.

Another object is to provide an improved broadband, multi-stage, high-gain transistor amplifier whose bandwidth is approximately that of the individual stages.

Another object is to provide an improved broadband, high-gain, transistor amplifier operating from one power supply.

These and other objects are achieved according to one embodiment of the invention by employing a transisto amplifier stage including a common emitter transisto amplifier circuit configuration with collector-to-base feedback and emitter peaking for frequency compensation The stage further includes an output emitter followe transistor circuit configuration through which the transistor amplifier stage can be coupled to a succeeding similar stage. A high-gain, large bandwidth amplifier i obtained by series-connecting a proper number of th amplifier stages, the resulting composite amplifier operating without the disadvantages and limitations as t gain or bandwidth encountered in the use of previousl proven amplifier.

Figure 1:
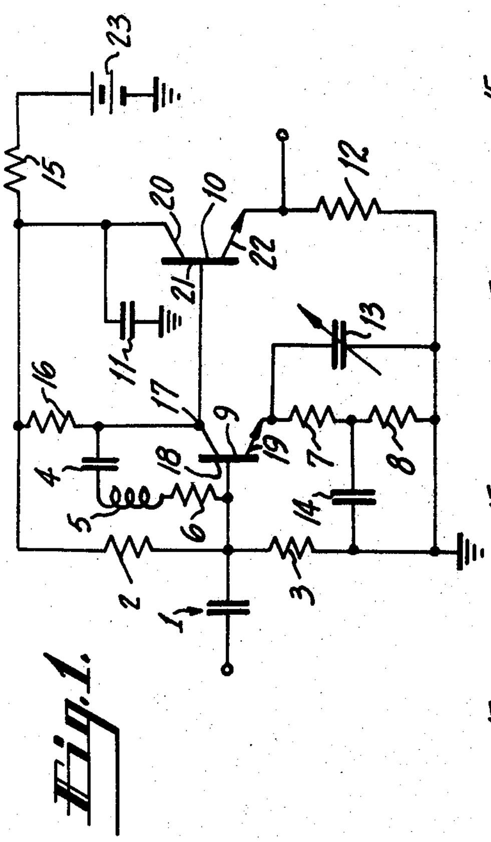
Figure 2:
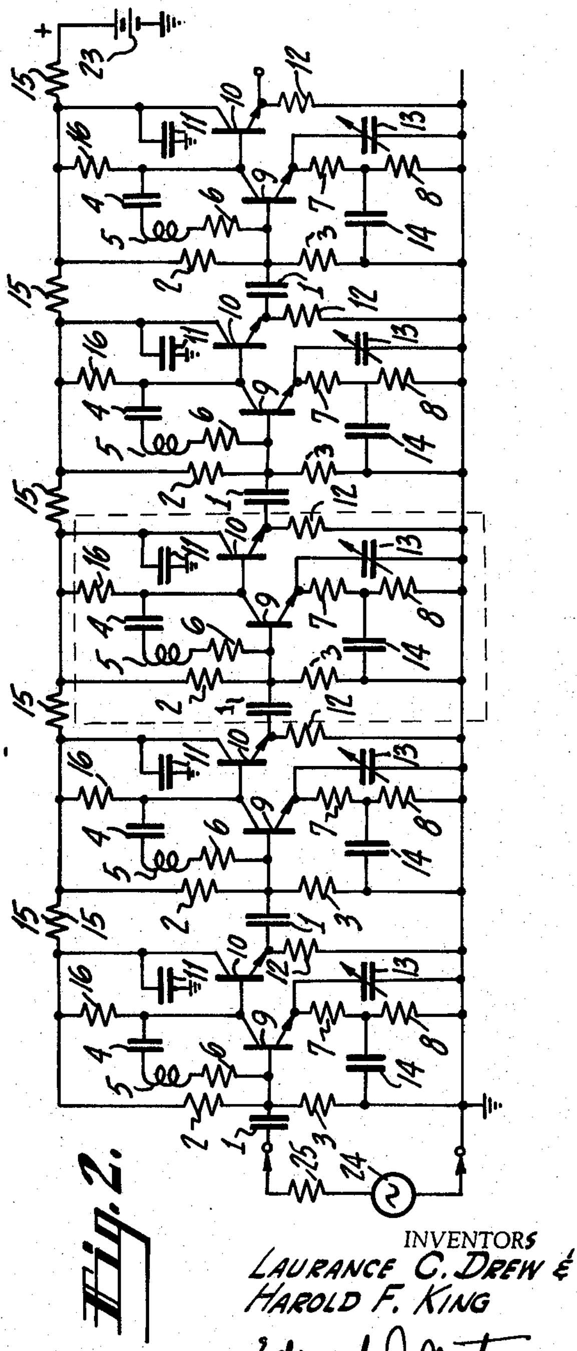

In order that the invention may be more clearly understood, reference is now made to the following descriptio in connection with the accompanying drawing in which FIG. 1 shows a transistor amplifier stage constructe according to one embodiment of the invention, and FIG. 2 shows a broadband high-gain transistor amplifier using five stages as shown in FIG. 1.

Referring to FIGURE 1, a transistor 9 has a base electrode 18, a collector electrode 17 and an emitter electrode 19. The emitter 19 is connected to a point o reference potential such as ground through series resistor 7, 8. A variable capacitor 13 is also connected betwee the emitter 19 and ground. The series combination o resistors 7 and 8 provide the necessary bias voltage at th emitter 19 to operate the transistor 9 in Class A mode Resistor 8 is by-passed to ground by a capacitor 14 t prevent this resistor 8 from introducing degeneration. Th capacitor 13 is used as an emitter peaking capacitor whic operates to provide high frequency compensation in con junction with the resistor 7. The collector 17 of transisto 9 is connected to one end of a load resistor 16. The othe end of the load resistor 16 is connected to a common bus The bus provides a connection via a resistor 15 to th positive terminal of a source of unidirectional potentia 23. Also connected to this bus is a resistor 2 which i conjunction with a resistor 3 forms a biasing networ for the base 18 of the transistor 9. The junction of resistors 2 and 3 is connected to the base, 18, the othe end of the resistor 3 being connected to ground.

A series network consisting of a resistor 6, an inducto 5, and a capacitor 4 is connected between the collector 1 and the base 18 of the transistor 9. This network provides base-to-base collector feedback and is effective a the low frequency end of the amplifier stage's frequenc response to provide gain stabilization. As the frequenc of input signal energy applied to the base 18 of transisto 9 via a coupling capacitor 1 is increased, the networ consisting of resistor 6, inductor 5 and capacitor 4 ha less effect on the gain.

The collector 17 of transistor 9 is directly connected t the base 21 of a second transistor 10. Transistor 10 i employed in an emitter follower configuration. Th emitter 22 of transistor 10 is connected to ground throug a resistor 12. The collector 20 of transistor 10 is connecte directly to the common bus. A capacitor 11 is connecte between ground and the junction of the collector 20 an the resistor 15. The combination of the resistor 15 an capacitor 11 serves as a filtering network to eliminat any power supply ripple that may be present from th power source 23. The filter comprising capacitor 11 an resistor 15 also serves to isolate the common bus of stage as shown in FIG. 1 from the common bus of a succeeding stage connected in the manner shown in FIG. 2

Briefly, the above transistor amplifier stage consists c a high gain Class A amplifier consisting of transistor and associated circuitry, using both emitter peaking an collector-to-base feedback frequency compensation. Th output from the collector of transistor 9 is fed direct nto the base of an emitter follower comprising transistor [0 and associated circuitry which serves to isolate the ]lass A amplifier from a succeeding stage.

FIGURE 2 shows five stages as shown in FIG. 1 con-iected together to form a broadband, high gain amplifier. dentical components are given the same reference nu-nerals and the third stage is bracketed for clearer repre-entation. The numerals assigned in FIG. 1 to the base, :ollector and emitter electrodes of the transistors 9 and 10 iave been eliminated in FIG. 2 for simplicity. Each of he stages has a specified gain in decibels. The gain is a unction of the transistors 9 and 10 and the collector oad 16 of the transistor 9, the compensating network :onsisting of reistor 6, inductor 5 and capacitor 4, and he combination of the resistor 7 and the peaking ca-)acitor 13. The gain of the composite amplifier shown in ?IGURE 2 is the sum of the decibel gain of each stage, vhere decibel gain is defined as twenty times the log-to-he-base-ten of the voltage gain. In the case shown the otal gain of the amplifier would be five times the gain n decibels of each stage. In addition to the high gain, the )andwidth of the composite broadband amplifier is ap-)roximately equal to the bandwidth of the individual stage o that bandwidth is not traded off for the gain. The com-)onents value from stage-to-stage can be identical, ex-:ept for the setting of the variable capacitor 13 which nay differ for each stage. As each stage is isolated from he succeeding stage by an emitter follower, capacitor 13 n each stage can be set without the need for further ad-ustment to provide maximum bandwidth of that stage. )ne thereby achieves maximum bandwidth for the com-)osite amplifier.

In operation an input signal is applied through a re-:istor 25 to the base of the transistor 9 in the first stage 'rom a source 24 which could be an oscillator, pulse gen-:rator, or any other suitable signal source. The resistor 25 s made approximately equal to the output impedance of he emitter follower stage.

A typical example of component values employed in ι broadband amplifier constructed in the manner of that :hown in FIGURE 2 are given below in Table 1.

TABLE 1

| | | |
|---|---|---|
| ]apacitor **1** | μμfd | 3,000 |
| Resistor **2** | ohms | 18,000 |
| Resistor **3** | do | 2,700 |
| ]apacitor **4** | μμf | 1,000 |
| nductor **5** | μhenries | .07 |
| Resistor **6** | ohms | 620 |
| Resistor **7** | do | 100 |
| Resistor **8** | do | 270 |
| [ransistor **9** | | 2N918 |
| [ransistor **10** | | 2N918 |
| ]apacitor **11** | mfd | .1 |
| Resistor **12** | ohms | 2,000 |
| ]apacitor **13** | μμfd | 4–45 |
| ]apacitor **14** | mfd | .02 |
| Resistor **15** | ohms | 22 |
| Resistor **16** | do | 2,000 |
| 3attery **23** | volts | +24 |
| Resistor **25** | ohms | 50 |

The amplifier shown in FIGURE 2 and built with the :omponent values indicated in Table 1 has a frequency esponse in excess of 300 megacycles and a gain in excess )f 50 decibels; provided proper high frequency construc-ion techniques are utilized. An amplifier is provided vhich exhibits both high gain and broad bandwidth, there )eing no significant trade-off in its operation as between ;ain and bandwidth.

The addition of more stages than the number shown in ?IGURE 2 will increase the gain of the amplifier by a actor of approximately 10 decibels per stage, while main-aining approximately the same bandwidth.

While N-P-N transistors are shown, P-N-P transistors an be used by reversing the power supply polarity in a manner understood in the art. The component values indicated in the example given are only typical of one embodiment and can be altered to fit the requirements of a particular application.

What is claimed is:

1. A cascaded video amplifier comprising a plurality of stages each of which has substantially the same first given gain, first given bandwidth, first given input impedance and first given output admittance; and a like plurality of coupling means each of which except one couples the output of a preceding one of said plurality of stages to the input of the next subsequent one of said plurality of stages of said amplifier and said one coupling means couples the output of the last of said plurality of stages to the output of said amplifier, each of said coupling means having substantially the same second given gain, second given bandwidth, second given input admittance and second given output impedance; wherein said first given gain is large relative to unity and said second given gain is substantially unity, said first given bandwidth is significantly smaller than said second given bandwidth, said second given input admittance is insignificant with respect to said first given output admittance over the entire first given bandwidth, and said second given output impedance is insignificant with respect to said first given input impedance over the entire first given bandwidth, whereby said amplifier provides a total gain for an input signal applied to the input of the first stage thereof substantially equal to the product of said first gains of all said plurality of stages and has an overall bandwidth substantially equal to said first given bandwidth.

2. The amplifier defined in claim 1, wherein each of said stages is a transistor stage and wherein each of said coupling means is an emitter follower.

3. The amplifier defined in claim 2, wherein the input of each emitter follower is directly connected to the output of the preceding transistor stage.

4. The amplifier defined in claim 1, wherein said first given bandwidth is wide and has a sharp high frequency roll-off.

5. The amplifier defined in claim 4, wherein each of said stages includes frequency-responsive negative feedback means for widening said first given bandwidth and providing said sharp high-frequency roll-off.

6. The amplifier defined in claim 5, wherein said frequency-responsive negative feedback means includes both a high-frequency current peaking negative current feedback means and a mid-frequency flattening negative voltage feedback means.

7. The amplifier defined in claim 6, wherein said negative current feedback means is adjustable.

8. The amplifier defined in claim 1, wherein said plurality is at least equal to three.

References Cited

UNITED STATES PATENTS

| | | | |
|---|---|---|---|
| 2,896,014 | 7/1959 | Loughlin | 330—94 X |
| 3,209,164 | 9/1965 | De Witt | 330—94 X |

FOREIGN PATENTS

| | | |
|---|---|---|
| 103,979 | 10/1936 | Australia. |
| 686,921 | 1/1940 | Germany. |

OTHER REFERENCES

Goedten: "Switching and Amplifier Applications for Diffused Base Silicon Transistors", Semiconductor Engineering Files (Raytheon) September 1959 pp. 1–12, 330–28.

ROY LAKE, *Primary Examiner.*

JAMES B. MULLINS, *Assistant Examiner.*

U.S. Cl. X.R.

330—21, 28, 94, 109, 172, 27, 78